United States Patent
Liu et al.

(10) Patent No.: US 11,395,436 B2
(45) Date of Patent: Jul. 19, 2022

(54) MODULAR TELECOMMUNICATIONS PATCH PANEL SYSTEM

(71) Applicant: CommScope Technologies LLC, Hickory, NC (US)

(72) Inventors: Zhihui Liu, Suzhou (CN); Jing Wang, Suzhou (CN); Danny Ghislain Thijs, Zonhoven (BE); Yu Zhao, Suzhou (CN); Wenyong Wu, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/062,111

(22) Filed: Oct. 2, 2020

(65) Prior Publication Data

US 2021/0112678 A1 Apr. 15, 2021

(30) Foreign Application Priority Data

Oct. 10, 2019 (CN) .......................... 201910956073.0

(51) Int. Cl.
*H05K 7/18* (2006.01)
*H04Q 1/02* (2006.01)

(52) U.S. Cl.
CPC ............ *H05K 7/186* (2013.01); *H04Q 1/025* (2013.01)

(58) Field of Classification Search
CPC . H04Q 1/13; H04Q 1/09; H01R 13/74; H01R 13/741; H01R 13/745; H01R 2201/16; H01R 2201/04; H01R 13/506; H01R 13/514; G02B 6/4452; H05K 7/186; H05K 7/1492
See application file for complete search history.

(56) References Cited

U.S. PATENT DOCUMENTS

| | | | |
|---|---|---|---|
| 5,836,786 A * | 11/1998 | Pepe | H01R 13/74 439/557 |
| 6,015,307 A | 1/2000 | Chiu et al. | |
| 6,504,726 B1 * | 1/2003 | Grabinger | H05K 1/0228 361/796 |

(Continued)

FOREIGN PATENT DOCUMENTS

| | | |
|---|---|---|
| WO | 99/19944 A1 | 4/1999 |
| WO | 2016/156644 A1 | 10/2016 |

(Continued)

OTHER PUBLICATIONS

"Mini-Com All Metal Shielded Modular Patch Panels, Installation Instructions", Panduit, 2 pages (2010).

(Continued)

*Primary Examiner* — Michael A Matey
(74) *Attorney, Agent, or Firm* — Merchant & Gould P.C.

(57) ABSTRACT

In accordance with some aspects of the disclosure, a modular telecommunications patch panel system is shown and described. The panel can include a mounting frame extending between a first end and a second end, the mounting frame defining a plurality of apertures for receiving telecommunications components, a first mounting ear forming a snap-fit connection with the mounting frame first end, in a first orientation, and a second mounting ear, identical to the first mounting ear, forming a snap-fit connection with the mounting frame second end, in a second orientation.

20 Claims, 13 Drawing Sheets

(56) References Cited

U.S. PATENT DOCUMENTS

| | | | |
|---|---|---|---|
| 6,537,106 B1* | 3/2003 | Follingstad | H04Q 1/13 439/534 |
| 6,866,541 B2 | 3/2005 | Barker et al. | |
| 7,094,095 B1* | 8/2006 | Caveney | G02B 6/3897 385/134 |
| 7,112,090 B2* | 9/2006 | Caveney | H01R 13/518 439/540.1 |
| 7,207,846 B2 | 4/2007 | Caveney et al. | |
| 7,220,145 B2 | 5/2007 | Denovich et al. | |
| 7,335,056 B1* | 2/2008 | Clark | H01R 13/518 439/534 |
| 7,367,850 B1* | 5/2008 | Chang | H04Q 1/116 439/540.1 |
| 7,534,135 B2* | 5/2009 | Follingstad | H04Q 1/09 439/534 |
| 7,544,090 B2* | 6/2009 | Follingstad | H01R 24/64 439/534 |
| 7,628,644 B1 | 12/2009 | Peluffo | |
| 7,854,624 B1 | 12/2010 | Pepe | |
| 7,874,865 B2 | 1/2011 | Tobey | |
| 7,901,236 B2* | 3/2011 | Patchett | H04Q 1/13 439/354 |
| 7,909,622 B2 | 3/2011 | Pepe et al. | |
| 7,914,324 B2* | 3/2011 | Pepe | H01R 13/641 439/540.1 |
| 8,834,199 B2* | 9/2014 | Foung | H04Q 1/13 439/540.1 |
| 9,356,384 B2* | 5/2016 | Follingstad | H04Q 1/09 |
| 10,585,256 B1* | 3/2020 | Henley | H01R 13/639 |
| 2003/0022552 A1* | 1/2003 | Barker | H04Q 1/068 439/540.1 |
| 2003/0129871 A1* | 7/2003 | Follingstad | H01R 24/64 439/534 |
| 2005/0159036 A1 | 7/2005 | Caveney et al. | |
| 2005/0191901 A1* | 9/2005 | Follingstad | H01R 13/518 439/534 |
| 2006/0025011 A1* | 2/2006 | Follingstad | H01R 35/04 439/534 |
| 2006/0228940 A1* | 10/2006 | Follingstad | H01R 24/64 439/534 |
| 2007/0184712 A1* | 8/2007 | Martich | H04Q 1/068 439/540.1 |
| 2008/0009183 A1* | 1/2008 | Wu | H01R 13/518 439/540.1 |
| 2008/0090461 A1* | 4/2008 | Pepe | H01R 13/659 439/649 |
| 2008/0096438 A1* | 4/2008 | Clark | H04Q 1/09 439/713 |
| 2008/0100069 A1 | 5/2008 | Morris | |
| 2008/0115956 A1* | 5/2008 | Fransen | H04Q 1/035 174/66 |
| 2008/0303392 A1* | 12/2008 | Pepe | H04Q 1/023 312/223.6 |
| 2009/0034226 A1* | 2/2009 | Herndon | H01R 13/745 361/822 |
| 2009/0068881 A1* | 3/2009 | Patchett | H01R 13/6658 439/540.1 |
| 2009/0232455 A1* | 9/2009 | Nhep | G02B 6/00 385/59 |
| 2009/0243757 A1 | 10/2009 | Xu et al. | |
| 2009/0274422 A1 | 11/2009 | Henry et al. | |
| 2010/0216335 A1 | 8/2010 | Cobb | |
| 2010/0227500 A1* | 9/2010 | Shih | H01R 13/518 439/540.1 |
| 2010/0255716 A1 | 10/2010 | Frey et al. | |
| 2011/0115494 A1 | 5/2011 | Taylor et al. | |
| 2012/0226807 A1 | 9/2012 | Panella et al. | |
| 2012/0244752 A1 | 9/2012 | Patel et al. | |
| 2013/0217249 A1 | 8/2013 | Patel et al. | |
| 2014/0080354 A1 | 3/2014 | Caveney et al. | |
| 2016/0021779 A1* | 1/2016 | Knight | H05K 7/186 361/679.01 |
| 2016/0080836 A1* | 3/2016 | Carreras García | H01R 24/62 439/638 |
| 2017/0229825 A1 | 8/2017 | Baines et al. | |
| 2017/0235076 A1 | 8/2017 | Solheid et al. | |
| 2017/0302040 A1 | 10/2017 | Taylor et al. | |
| 2018/0287312 A1* | 10/2018 | De Dios Martín | H01R 13/745 |
| 2020/0351573 A1* | 11/2020 | Shih | H04Q 1/13 |
| 2021/0112316 A1 | 4/2021 | Liu et al. | |
| 2021/0185417 A1 | 6/2021 | Shih | H04Q 1/13 |

FOREIGN PATENT DOCUMENTS

| | | |
|---|---|---|
| WO | 2018/034870 A1 | 2/2018 |
| WO | 2018/236875 A1 | 12/2018 |
| WO | 2019/094558 A1 | 5/2019 |
| WO | 2019/094560 A1 | 5/2019 |

OTHER PUBLICATIONS

"Mini-Com® All Metal Shielded Modular Patch Panels, Installation Instructions, Specification Sheet", Panduit, 3 pages (2016).

* cited by examiner

MODULAR TELECOMMUNICATIONS PATCH PANEL SYSTEM

RELATED APPLICATION

This application claims priority to Chinese Patent Application Number 201910956073.0 filed on Oct. 10, 2019 and entitled Modular Telecommunications Panel System and Telecommunications Module, the entirety of which is incorporated by reference into this application.

BACKGROUND

Patch panels are commonly used to enable inter-connection or cross-connection between telecommunications equipment. A typical patch panel includes a cable termination interface (e.g., optical adapters, electrical jacks, etc.) to connect one or more patch cables to respective connector elements. Additionally, patch panels can include fixtures to facilitate cable management and organization. Patch panels that provide more effective and/or efficient methods for cable termination and management are desired.

SUMMARY

In accordance with some aspects of the disclosure, a modular telecommunications patch panel system is shown and described. A modular telecommunications panel system can include a panel frame extending between a first end and a second end and extending between a front side and a rear side, the panel frame defining a module opening extending between the front and rear sides, and can include a telecommunications module removably received within the panel frame module opening, the telecommunications module including either an aperture for receiving a telecommunications component or including a telecommunications component. In one aspect, the panel frame and telecommunications module are configured such that the telecommunications module can be received into and removed out of the module opening from either the front side of the panel frame or the rear side of the panel frame.

In some examples, the telecommunications module is secured to the panel frame with a snap-fit type connection.

In some examples, the telecommunications module includes a plurality of apertures configured for receiving a plurality of telecommunications components configured as RJ-type jacks.

In some examples, the telecommunications module houses a plurality of telecommunications components configured as RJ-type jacks.

In some examples, the telecommunications module aperture includes a plurality of apertures configured for receiving RJ-type jacks.

In some examples, the telecommunications module houses a plurality of RJ-type jacks.

In some examples, the telecommunications module includes a first part of a first connection arrangement at each of first and second sides of the telecommunications module, and wherein the panel frame aperture has a pair of sidewalls with each defining a second part of the first connection arrangement interconnecting with the first part of the first connection arrangement.

In some examples, the telecommunications module defines a first part of a second connection arrangement at each of top and bottom sides of the telecommunications module, and wherein the panel frame aperture has a top wall and a bottom wall with each defining a second part of the second connection arrangement interconnecting with the first part of the second connection arrangement.

In some examples, the second part of the first connection arrangement acts as a stop member for the telecommunications module when the telecommunications module is inserted from the rear side of the panel frame, and wherein the second part of the second communication arrangement acts as a stop member for the telecommunications module when the telecommunications module is inserted from the front side of the panel frame.

In some examples, the panel frame defines a 1 U rack height. In some examples, the panel frame defines a greater than 1 U rack height.

In some examples, the panel frame is unitarily constructed as a single component.

In some examples, the panel frame is formed from a polymeric material.

In some examples, the module opening includes at least four module openings.

A modular telecommunications panel can include a panel frame defining a module opening extending between the front and rear sides, the panel frame including mounting locations for mounting the panel frame to a chassis and can include a telecommunications module removably received within the module opening from either the front side of the panel frame or the rear side of the panel frame.

In some examples, the telecommunications module is secured to the panel frame with a snap-fit type connection.

In some examples, the telecommunications module aperture includes a plurality of apertures configured for receiving RJ-type jacks.

In some examples, the telecommunications module houses a plurality of RJ-type jacks.

In some examples, the telecommunications module includes a first part of a first connection arrangement at each of first and second sides of the telecommunications module, and wherein the panel frame aperture has a pair of sidewalls with each defining a second part of the first connection arrangement interconnecting with the first part of the first connection arrangement.

In some examples, the telecommunications module defines a first part of a second connection arrangement at each of top and bottom sides of the telecommunications module, and wherein the panel frame aperture has a top wall and a bottom wall with each defining a second part of the second connection arrangement interconnecting with the first part of the second connection arrangement.

In some examples, the second part of the first connection arrangement acts as a stop member for the telecommunications module when the telecommunications module is inserted from the rear side of the panel frame, and wherein the second part of the second communication arrangement acts as a stop member for the telecommunications module when the telecommunications module is inserted from the front side of the panel frame.

In some examples, the panel frame defines a 1 U rack height.

In some examples, the panel frame is unitarily constructed as a single component.

In some examples, the panel frame is formed from a polymeric material.

In some examples, the module opening includes at least four module openings.

A telecommunications module receivable into a module opening in a panel frame through front and rear sides of the panel frame can include a main body extending between first and second ends, top and bottom sides, and front and rear sides, the main body either including an aperture for receiving a telecommunications component or including a telecommunications component, and can include a pair of deflectable latch arms located proximate the first and second ends of the main body, the pair of deflectable latch arms being integrally formed with the main body.

In some examples, the aperture includes a plurality of apertures configured for receiving RJ-type jacks.

In some examples, the telecommunications module houses a plurality of RJ-type jacks.

In some examples, the module is sized to fit within a panel frame defining a 1 U rack height.

In some examples, the aperture includes at least six apertures.

A variety of additional inventive aspects will beset forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
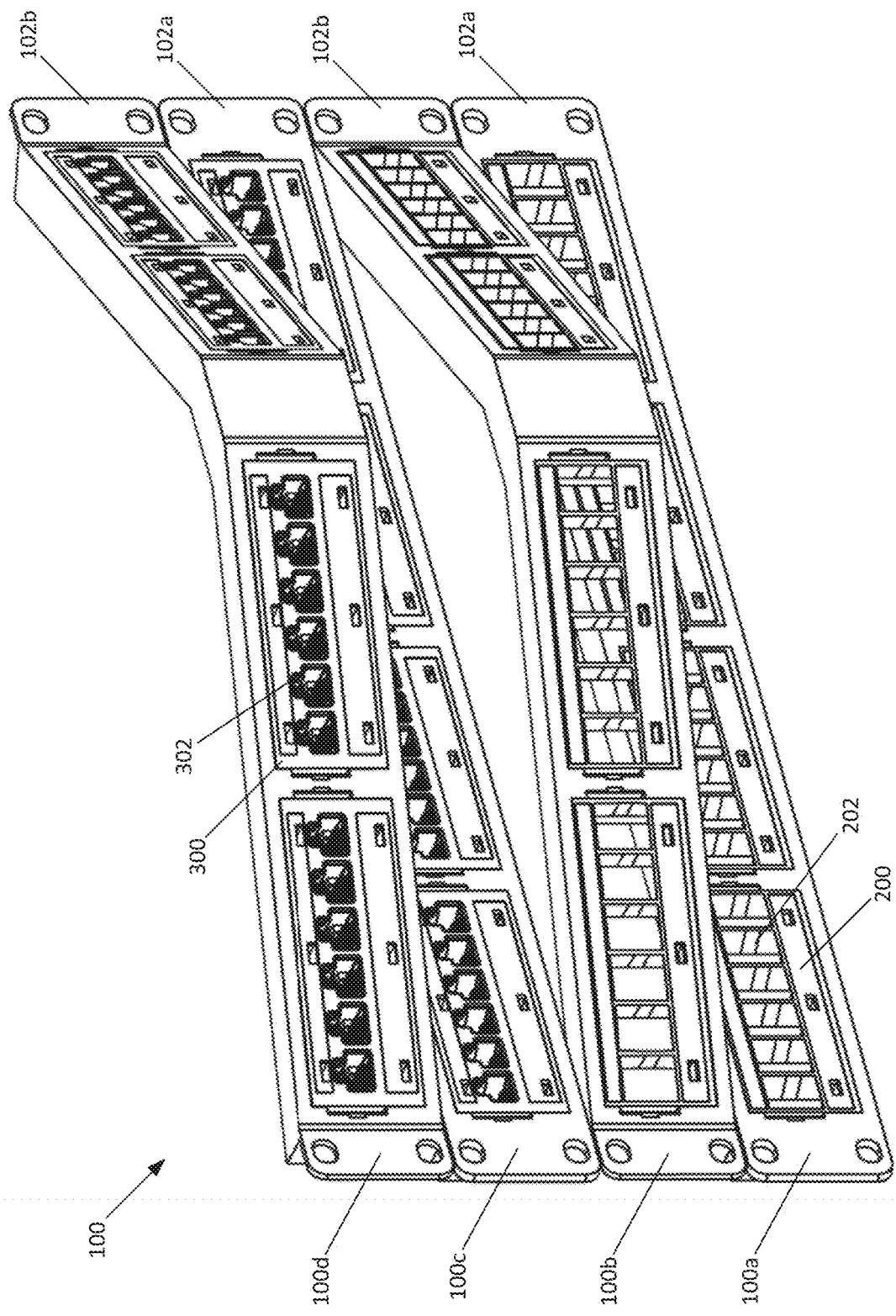
FIG. 1 is a front perspective view of an example modular telecommunications patch panel system having features in accordance with the principles of the present disclosure.
Figure 2:
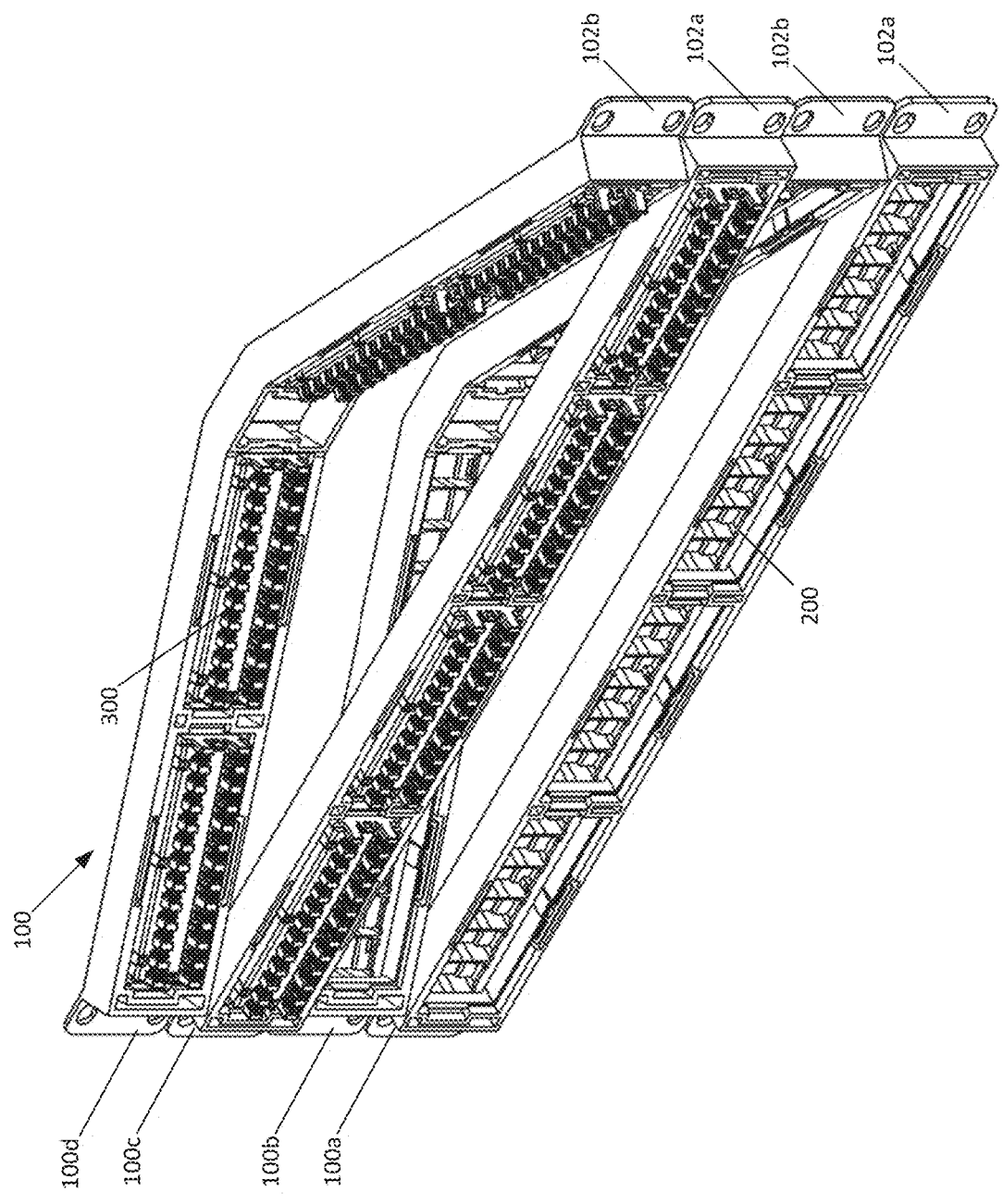
FIG. 2 is a rear perspective view of the example modular telecommunications patch panel system shown in FIG. 1.
Figure 4:
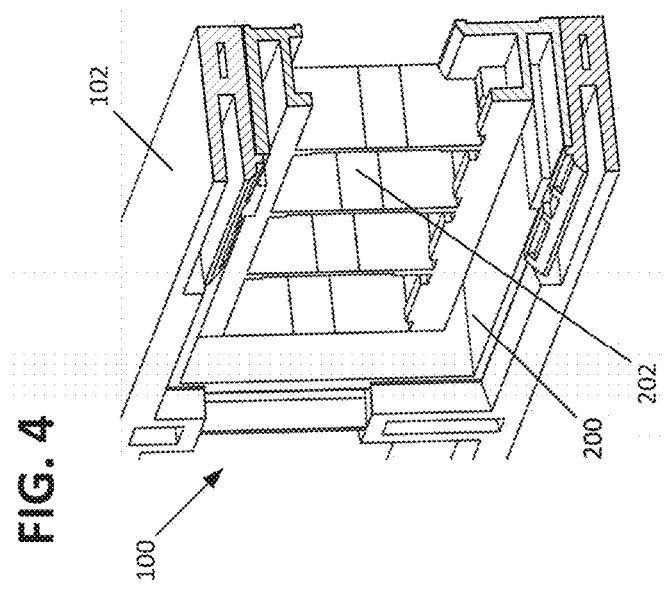
FIG. 4 is a rear cross-sectional perspective view of a portion of the example modular telecommunications patch panel system shown in FIG. 1.
Figure 3:
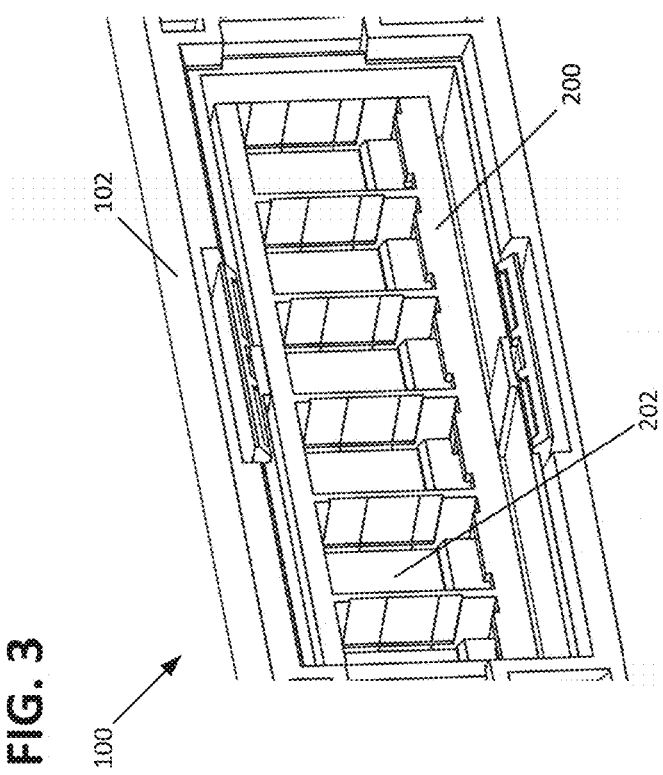
FIG. 3 is a rear perspective view of a portion of the example modular telecommunications patch panel system shown in FIG. 1.
Figure 5:
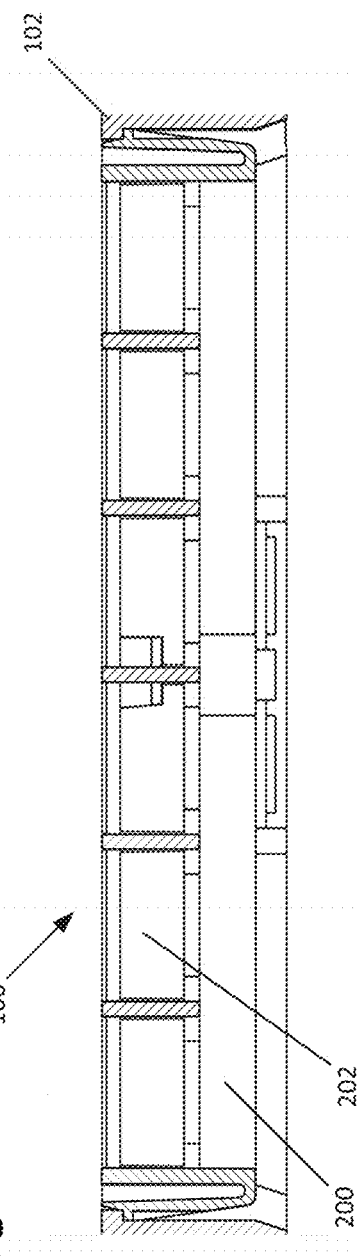
FIG. 5 is atop cross-sectional view of a portion of the example modular telecommunications patch panel system shown in FIG. 1.
Figure 6:
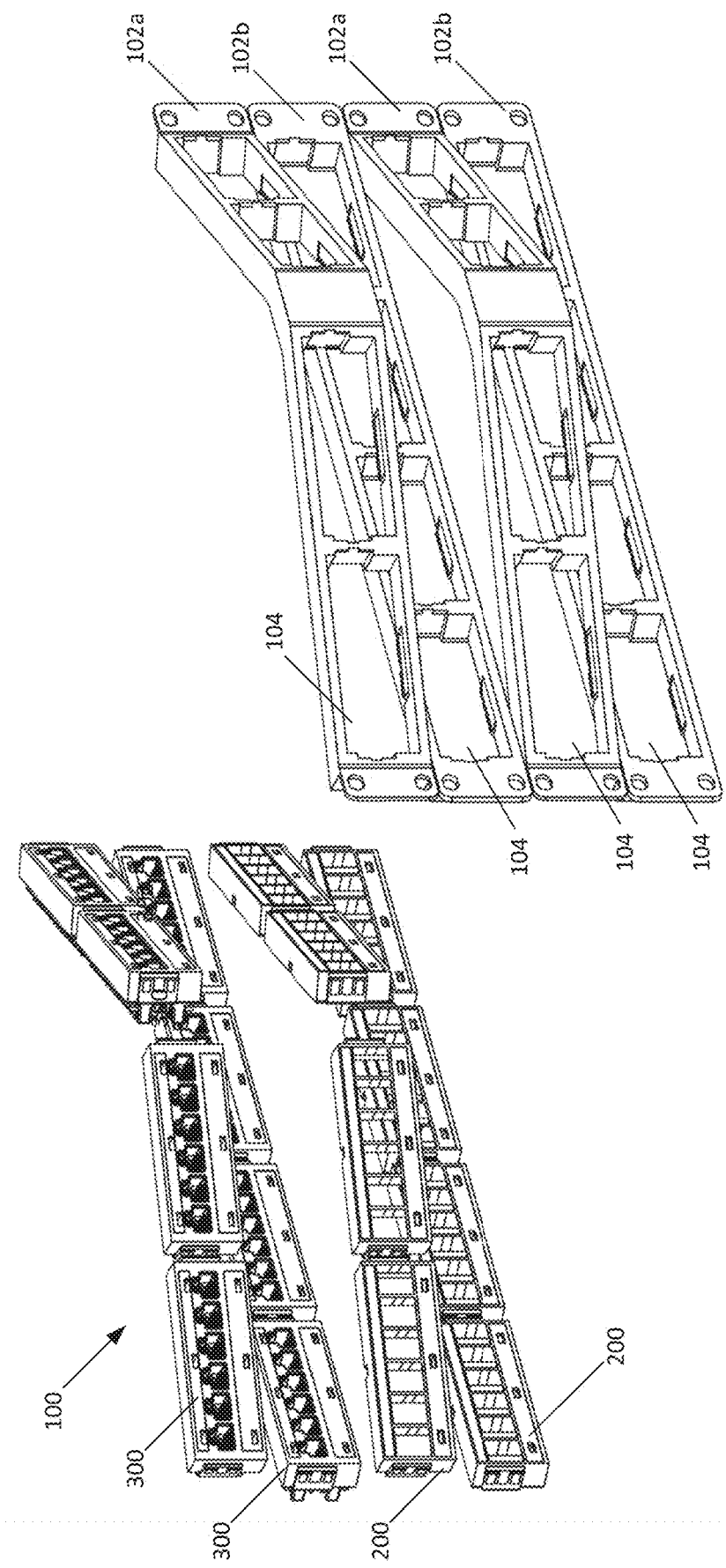
FIG. 6 is an exploded front perspective view of the example modular telecommunications patch panel system shown in FIG. 1.

Referring to FIGS. 1 to 6, a modular telecommunications patch panel system 100 is shown and described. In one aspect the components of the patch panel system 100 can be arranged to provide different panel configurations. For example, FIGS. 1 and 2, show four different configurations 100a to 100d with two different panel frame styles and two different telecommunications module styles. For panel systems 100a and 100c, a liner or straight panel frame 102a is provided. For panel systems 100b and 100d, a v-shaped panel frame 102a is provided. For ease of reference, the panel frames 102a, 102b are collectively referred to as panel frame 102 when describing common features.

Panel systems 110a, 110b are also shown as including telecommunications modules 200 received into module openings 104 of the panel frames 102a, 102b. In one aspect, the modules 200 define apertures 200a configured for receiving separate telecommunications components, for example, individual RJ-type jacks. In the example presented, six apertures 200a for receiving RJ-type jacks are provided within each module 200, however more or fewer apertures 200a could be provided. Also, the module 200 could be configured with apertures 200a for receiving other types of telecommunications components, such as fiber optic connectors.

Panel systems 100c, 110d are also shown as including telecommunications modules 300 received into module openings 104 of the panel frames 102a, 102b. In contrast to the modules 200, the modules 300 are provided with telecommunications components 302 instead of apertures 200a for receiving telecommunications components. As shown, the telecommunications modules 300 house a plurality of telecommunications components 302, for example RJ-type jacks. In the example presented, six RJ-type jacks are provided within each module 300, however more or fewer jacks could be provided. Also, the module 300 could be configured to house other types of telecommunications components, such as fiber optic connectors.

Figure 7:
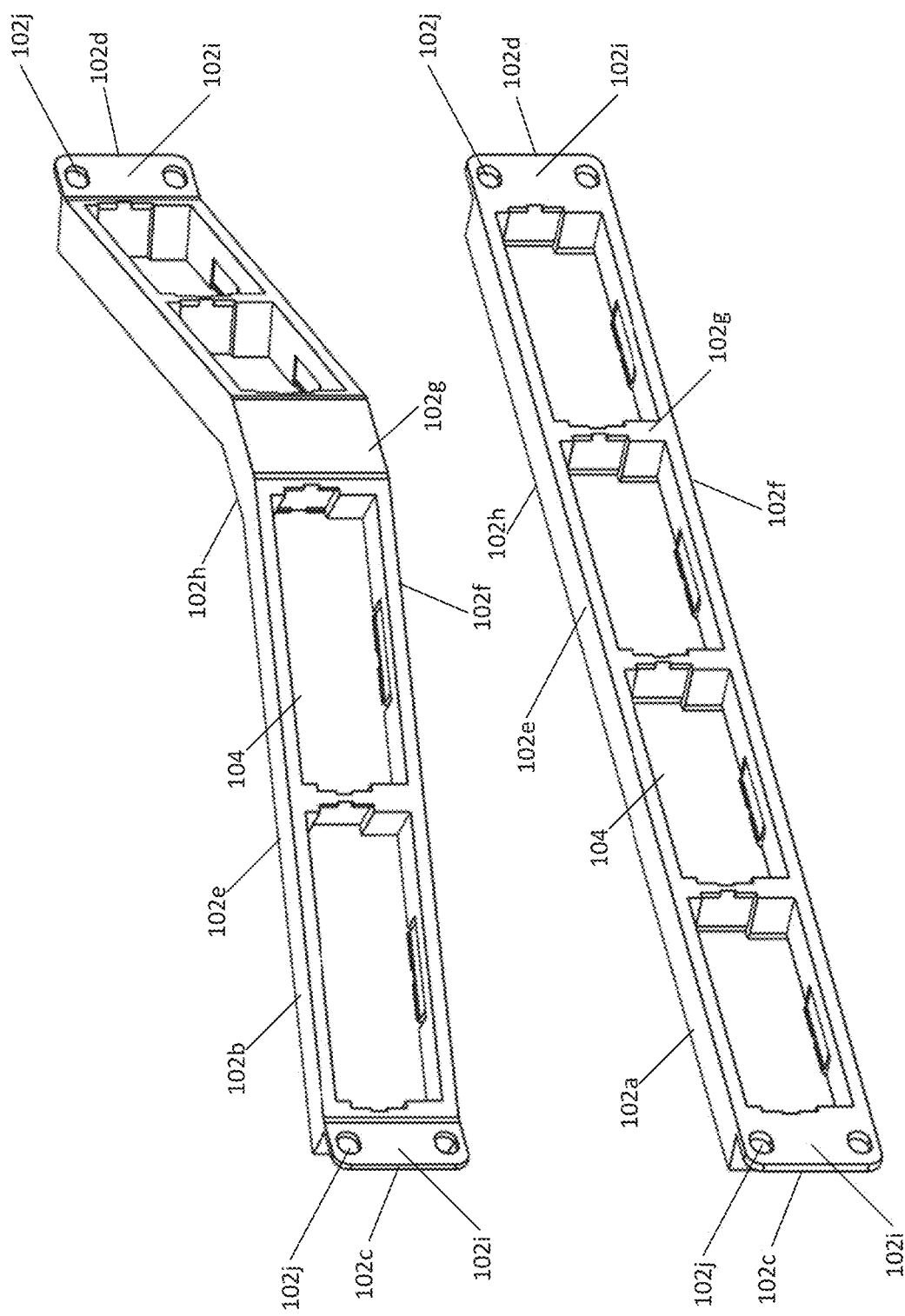
FIG. 7 is a front perspective view of a pair of panel frames of the example modular telecommunications patch panel system shown in FIG. 1.
Figure 8:
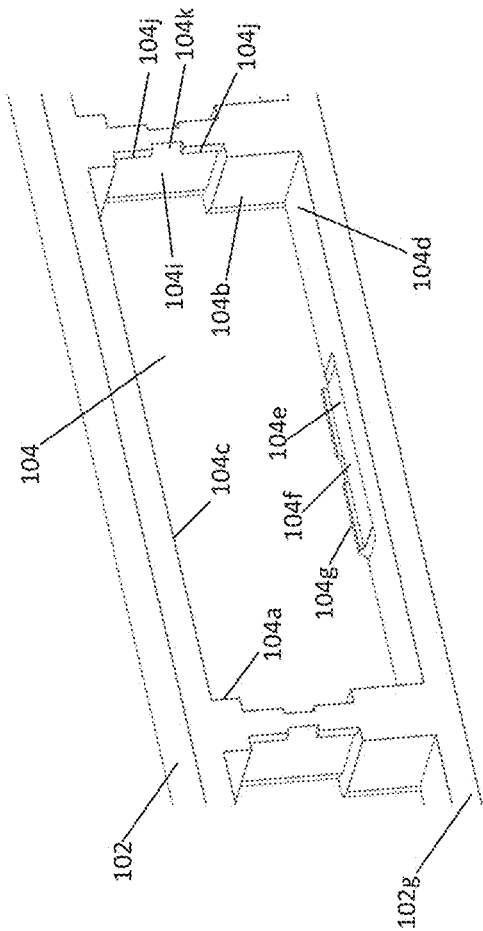
FIG. 8 is a front perspective view of a single module opening of the panel frames shown in FIG. 7.
Figure 9:
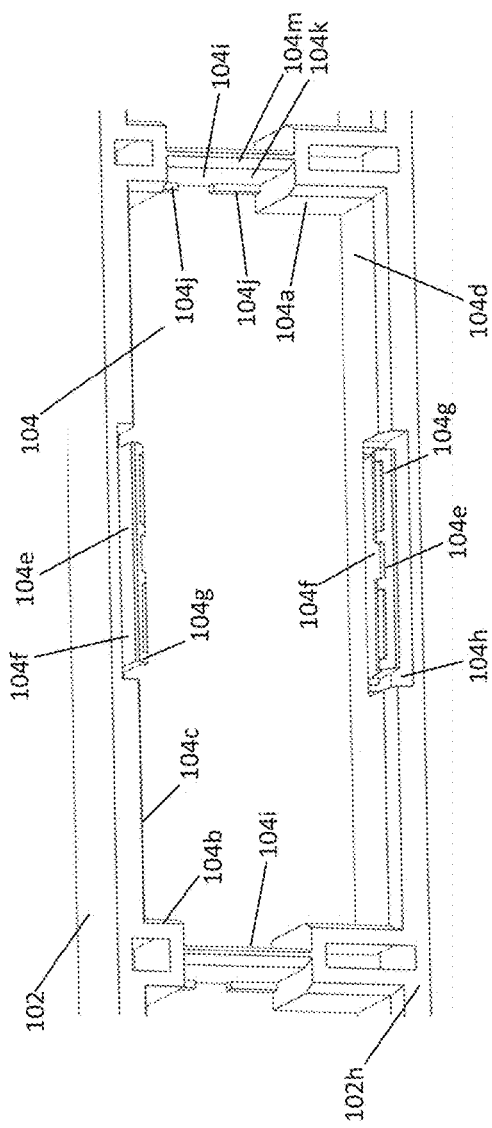
FIG. 9 is a rear perspective view of the single module opening shown in FIG. 8.
Figure 10:
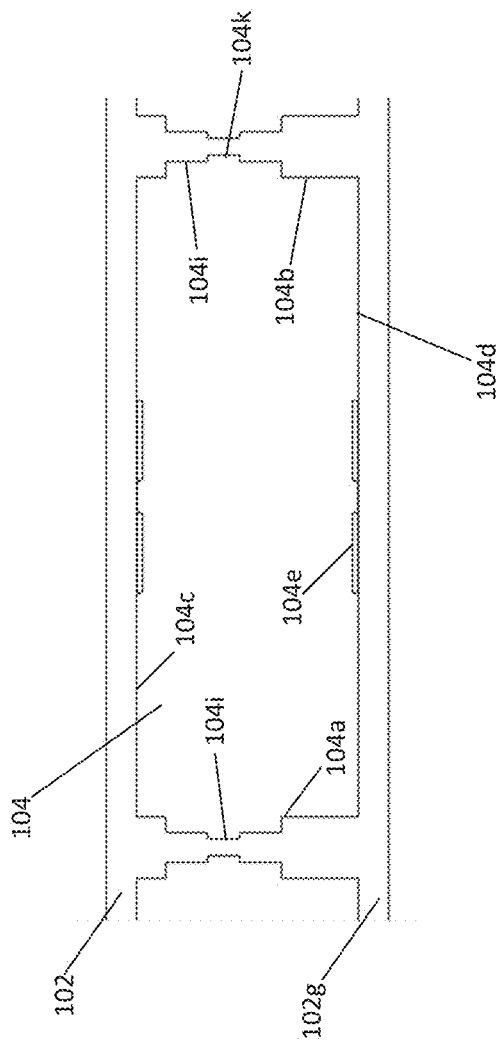
FIG. 10 is a front view of the single module opening shown in FIG. 8.
Figure 11:
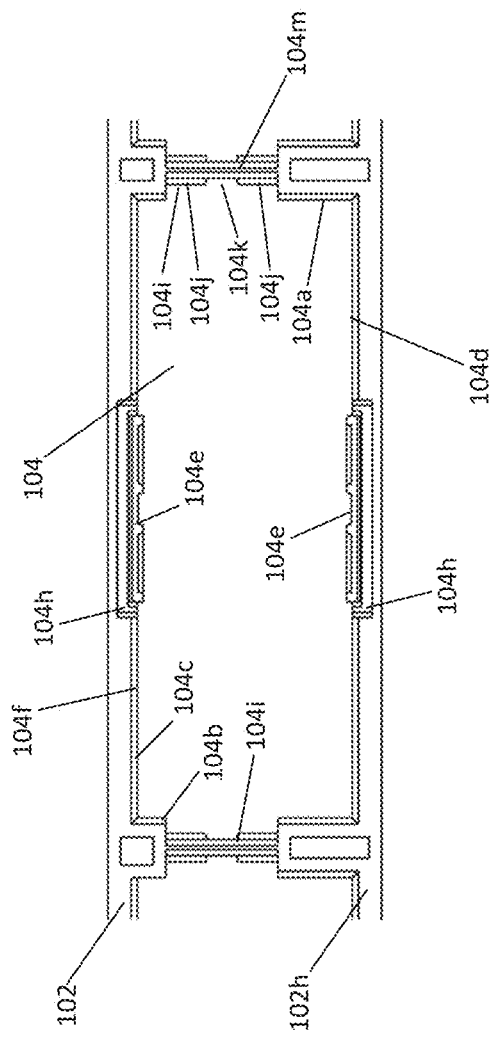
FIG. 11 is a rear view of the single module opening shown in FIG. 8.
Figure 12:
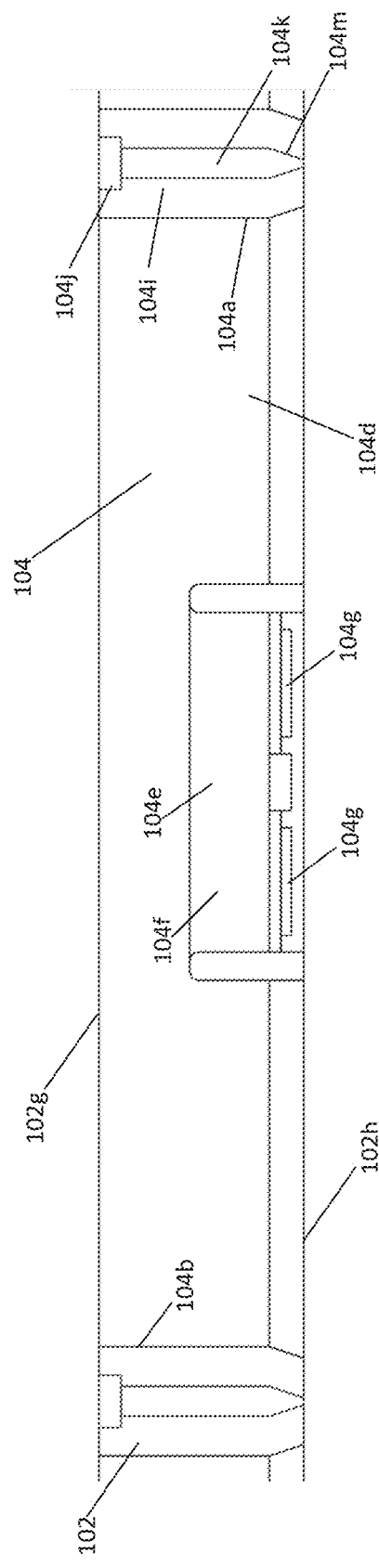
FIG. 12 is a top cross-sectional view of the single module opening shown in FIG. 8.
Figure 13:
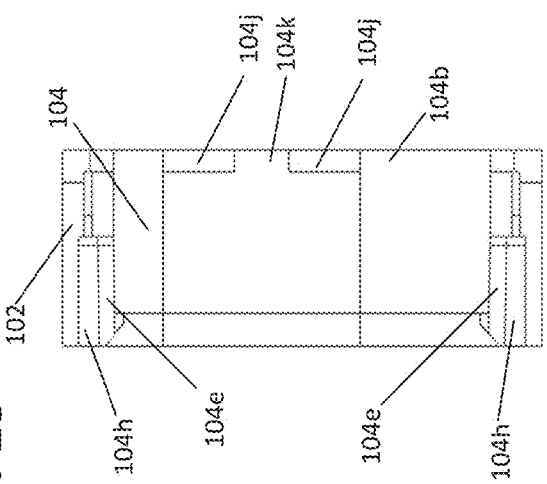
FIG. 13 is a side cross-sectional view of the single module opening shown in FIG. 8.
Figure 14:
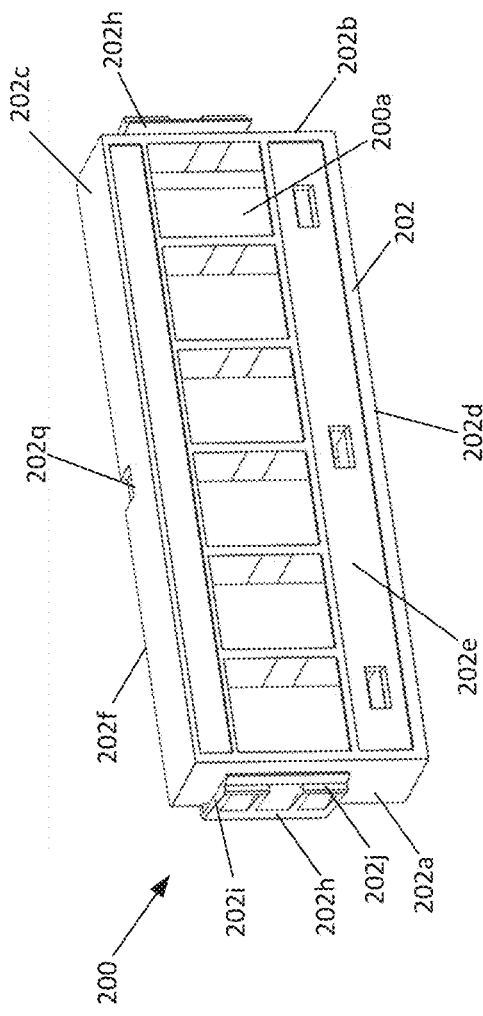
FIG. 14 is a front perspective view of a first telecommunications module of the example modular telecommunications patch panel system shown in FIG. 1.
Figure 15:
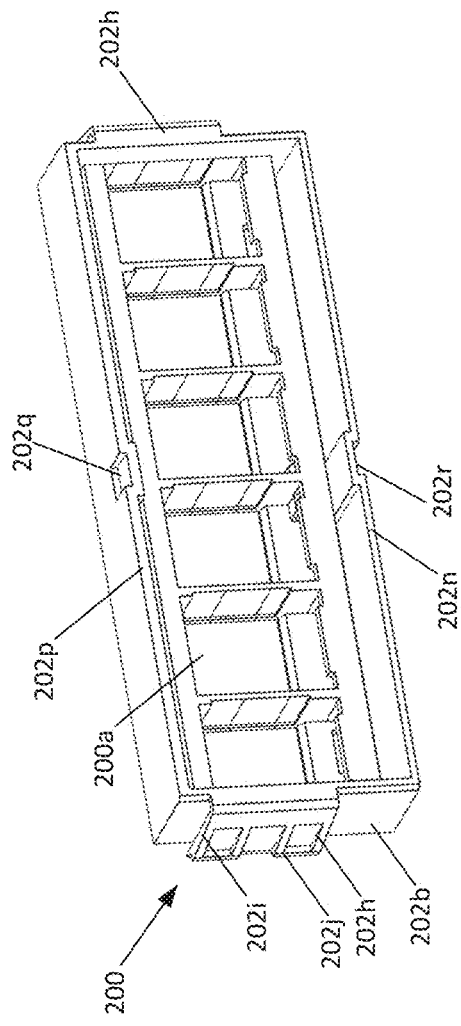
FIG. 15 is a rear view of the telecommunications module shown in FIG. 14.
Figure 17:
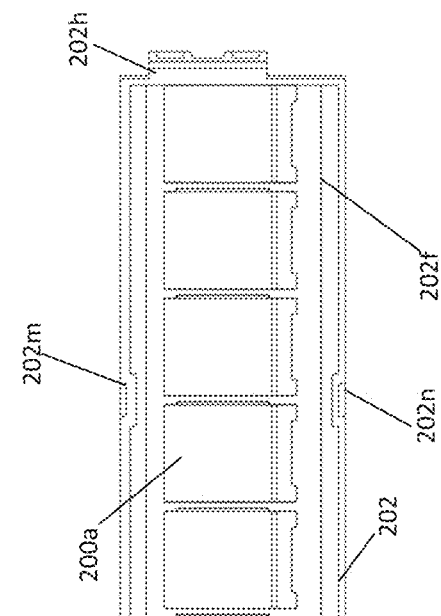
FIG. 17 is a rear view of the telecommunications module shown in FIG. 14.
Figure 19:
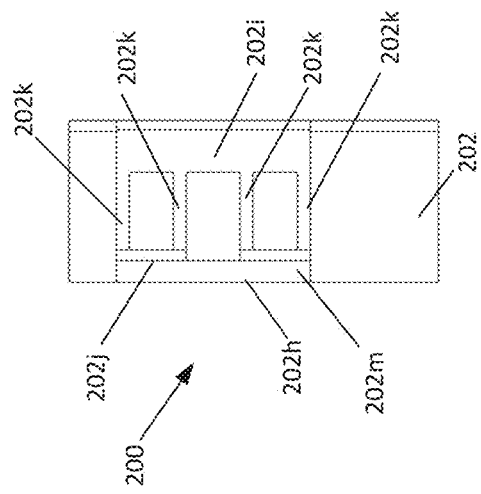
FIG. 19 is a side view of the telecommunications module shown in FIG. 14.
Figure 16:
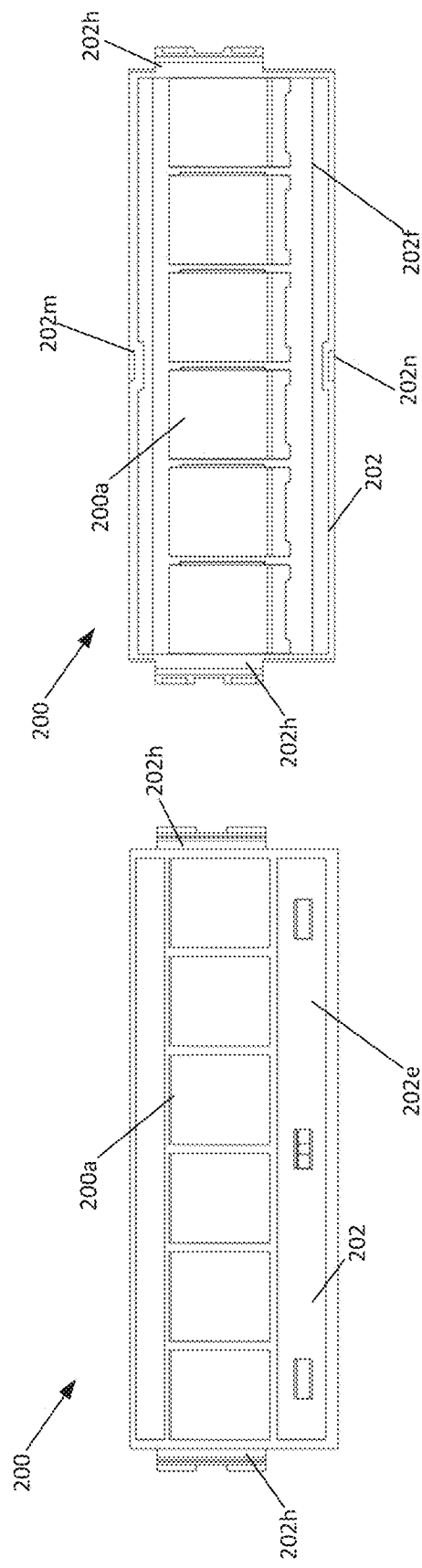
FIG. 16 is a front view of the telecommunications module shown in FIG. 14.
Figure 18:
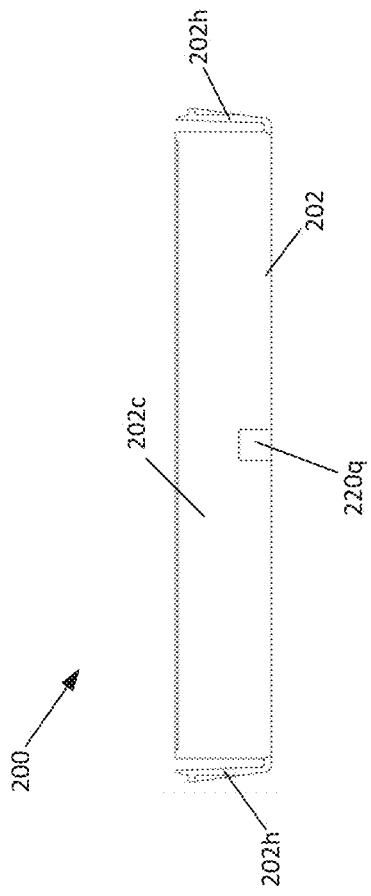
FIG. 18 is a top view of the telecommunications module shown in FIG. 14.
Figure 20:
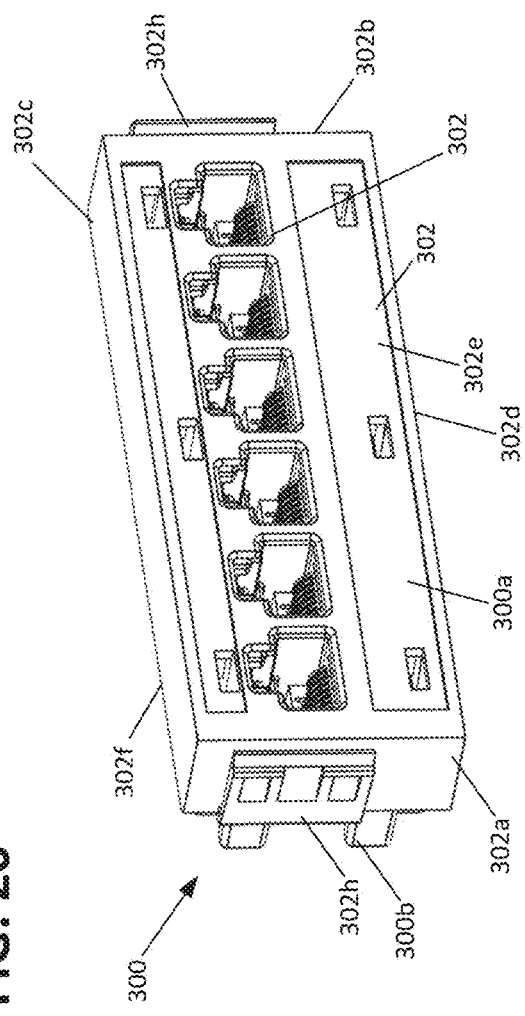
FIG. 20 is a front perspective view of a second telecommunications module of the example modular telecommunications patch panel system shown in FIG. 1.
Figure 21:
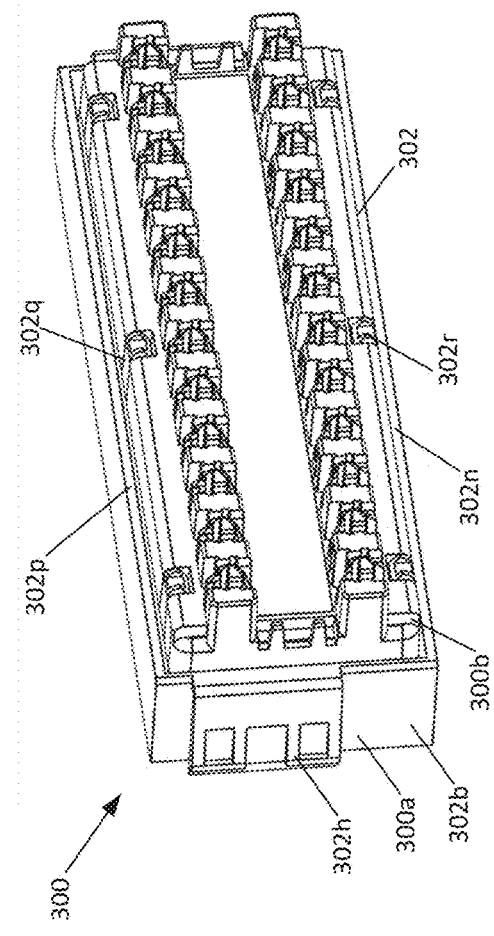
FIG. 21 is a rear view of the telecommunications module shown in FIG. 20.
Figure 23:
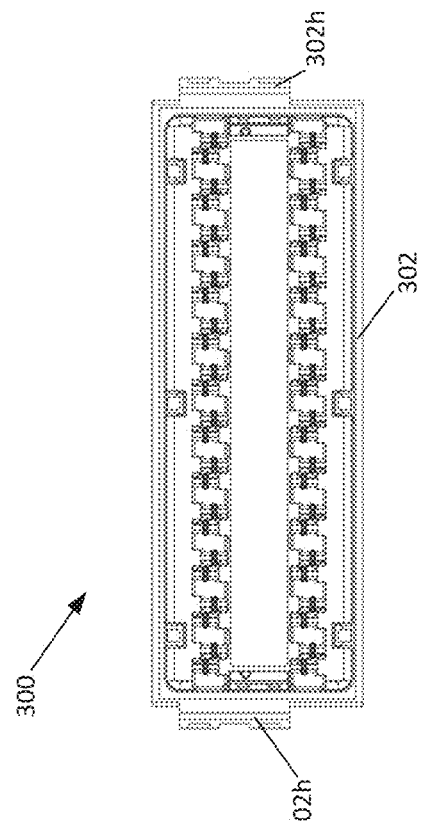
FIG. 23 is a rear view of the telecommunications module shown in FIG. 21.
Figure 22:
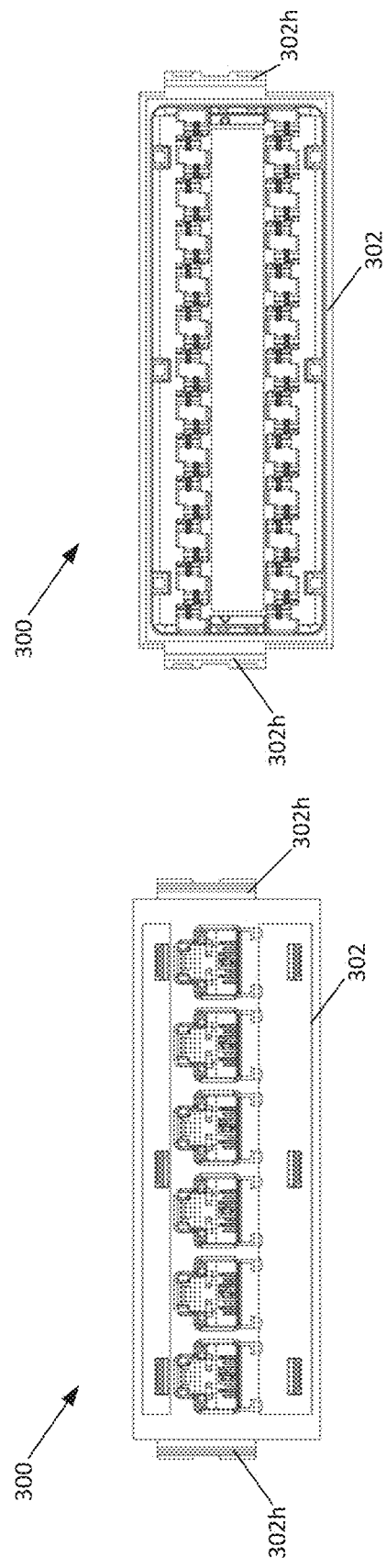
FIG. 22 is a front view of the telecommunications module shown in FIG. 20.
Figure 25:
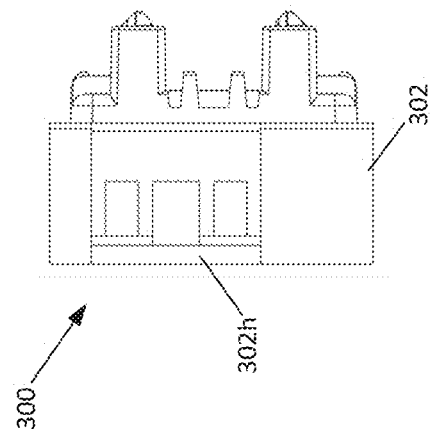
FIG. 25 is a side view of the telecommunications module shown in FIG. 23.
Figure 24:
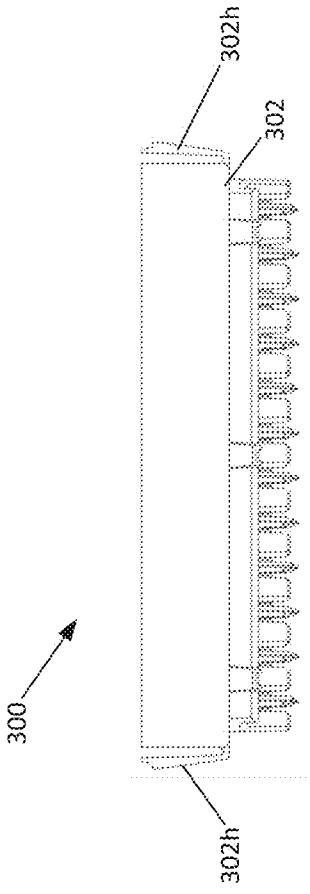
FIG. 24 is a top view of the telecommunications module shown in FIG. 22.

In the example shown, four modules 200, 300 are supported by each panel frame 102. However, the panel frames 102 could be configured to include fewer or more openings to support a different number of modules 200, 300. In one aspect, each panel frame 102 can be defined as extending between a first end 102c and a second end 102d, extending between a top side 102e and a bottom side 102f, and extending between a front side 102g and a rear side 102h. As referenced at FIG. 7, each of the panel frames 102 is provided with a pair of mounting ears 102i defining openings 102j for receiving fasteners, such that the panel frames 102 can be mounted to a chassis. In the example shown, the panel frames 102 define a 1 U rack height. However, the panel frames 102 could be configured to define a different rack height, for example a 2 U, 3 U, 4 U or greater rack height defining singular or multiple rows of openings 104.

Referring to FIGS. 8 to 13, a single panel frame opening 104 is shown in greater detail such that the features interconnecting with and retaining the modules 200, 300 can be more easily viewed. In one aspect, each frame opening 104 is defined by a pair of sidewalls 104a, 104b, a top wall 104c, and a bottom wall 104d. In one aspect, a deflectable latch 104e is provided at each of the top and bottom walls 104c, 104d, with each deflectable latch 104e including a deflectable arm 104f and a latch member 104g. As discussed later, the latch member 104g engages with a catch surface of one of the modules 200, 300 to aid in retaining the module 200, 300 within the opening 104. In one aspect, a recess 104h is provided such that the deflectable latch 104e can deflect into the recess 104h without increasing the overall height of the panel frame 102 during installation of a module 200, 300.

In one aspect, each of the sidewalls 104a, 104b defines a recess 104i with a catch surfaces or protrusion 104j extending therefrom proximate the front side 102g of the panel 102. As discussed later, the recesses 104i and catch surfaces 104j interact with a deflectable latch 202h of the modules 200, 300 to aid in retaining the module 200, 300 within the opening 104, as most easily viewed at FIGS. 3 to 5. In one aspect, the catch surfaces 104j define a further recess 104k such that a tool, such as a screwdriver, can extend through the recess 104k to disengage the module deflectable latch 202h from the catch surfaces 104j. In one aspect, the sidewalls 104h, 104b are provided with a narrowed portion 104k that partially defines the recesses 104k and that has a beveled end 104m such that the module deflectable latch is more easily guided in to the recess 104k.

Referring to FIGS. 14 to 19, the module 200 is shown in further detail. In one aspect, the module 200 has a main body 202 that extends between a first end 202a and a second end 202b, extending between a top side 202c and a bottom side 202d, and extending between a front side 202e and a rear side 202f.

As stated previously, the module 200 also defines a plurality of apertures 200a extending between the front and rear sides 202e, 202f. The apertures 200a are configured to hold one or more types of cable termination interfaces, such as electrical jacks. In other implementations, however, the apertures 200a could hold optical adapters or other media interfaces. In the example shown, module 200 defines 6 apertures 200a in a single row array. However, more or fewer apertures 200a may be provided. The apertures 200a can also be provided in more than one row, such as two rows. Apertures 200a can be sized to fit any of a plurality of types of jacks, for example RJ-type telecommunications jacks. The apertures 200a may be sized to receive jacks of the type shown and described in PCT International Patent Application Publication WO 2019/094560, published on May 16, 2019 and PCT PCT International Patent Application Publication WO 2016/156644, filed on Mar. 26, 2016, the entireties of which are incorporated by reference herein.

As mentioned previously, the module 200 is provided with a pair of deflectable latches 202h proximate the first and second ends 202a, 202b. As shown, each of the deflectable latches 202h includes a deflectable arm 202i and a latch member 202j. The latch member 202j engages with the catch surfaces 104j of the panel frame 102 to aid in retaining the module 200 within the opening 104, as most easily viewed at FIGS. 3 to 5. The deflectable latches 202h can also include ramped surfaces 202k and 202m for aiding in guiding the deflectable latches into and out of the openings 104 of the panel frame 102. In one aspect, the ramped surface 202m can act as a surface against which a tool can act to disengage the deflectable latch 202h from the catch surface 104j.

The module 200 is also shown as being provided with catch surfaces 202n proximate the rear side 202j of the module 200 for catching the deflectable latches 104e of the frame 102. In the example shown, the catch surfaces 202n, 202p coincide with the edge of the rear side 202f of the main body 202. The module 200 is also provided with a pair of recesses 202q, 202r on the top and bottom sides 202c, 202d to enable a tool, such as a screwdriver, to extend through the recesses 202m, 202n to disengage the panel frame deflectable latches 104e from the catch surfaces 202k.

Referring to FIGS. 20 to 25, the module 300 is shown in further detail. The module 300 differs from module 200 in that, as stated previously, telecommunications components 302 (e.g. RJ-type jacks mounted to a common printed circuit board) are provided instead of apertures 200a. To facilitate such a construction, the module 300 has cooperating housing parts 300a, 300b that together form the main body 302 of the module 300. In one aspect, the main body 302 extends between a first end 302a and a second end 302b, extending between a top side 302c and a bottom side 302d, and extending between a front side 302e and a rear side 302f. Proximate the first and second ends 302a, 302b, the module 300 is provided with deflectable latches 302h that are the same as the deflectable latches 202h associated with the module 200. Accordingly, the features of the deflectable latches 302h need not be further discussed as the above-provided description for deflectable latches 202h is applicable to deflectable latches 302h, the main body 302 also defines catch surfaces 302n, 302p in the same general configuration as shown and described for the catch surfaces 202n, 202p for the module 200. In contrast to the recesses 202q, 202r provided for the module 200, the module 300 is provided with members 302q, 302r which can be used as a surface against which a tool can act to disengage the deflectable latches 104e from the catch surfaces 302n, 302p.

Figure 26:
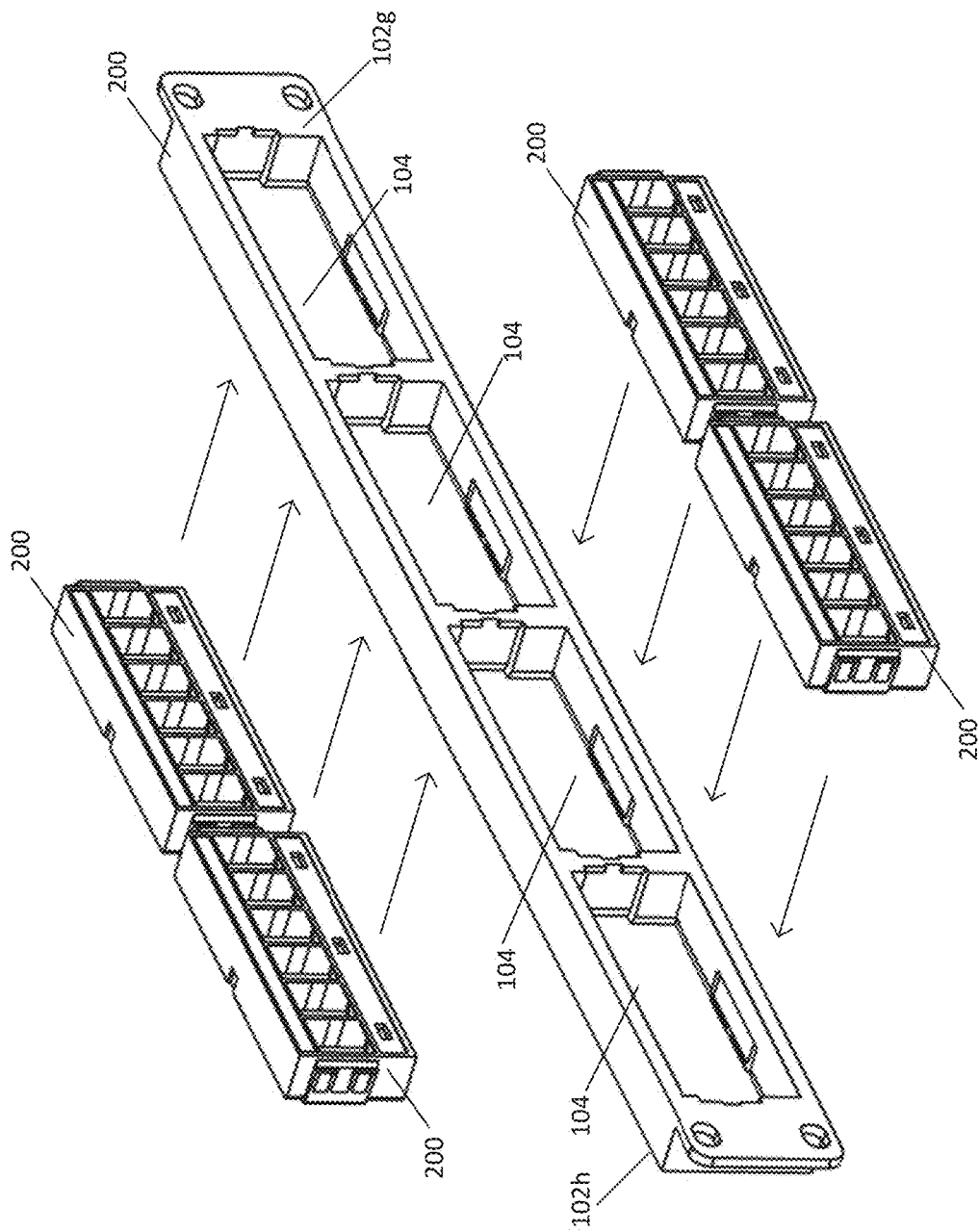
FIG. 26 is an perspective view of a plurality of the first telecommunications modules and a panel frame shown in FIG. 1, with two of the modules aligned for insertion into module openings of the panel frame through the front side of the panel frame and with two of the modules aligned for insertion into the module openings of the panel frame through the rear side of the panel frame.

With the disclosed configuration, and as illustrated at FIG. 26, the modules 200, 300 can be installed from the front side 102e of the panel frame 102 or from the rear side 102g of the panel frame 102. When the modules 200, 300 are inserted into the openings 104 from the front side 102g of the panel frame 102, the latch members 104g act as a stop surface against the catch surfaces 202n, 302n, 202p, 302p of the modules 200, 300. As abutment of these surfaces occurs, the deflectable latches 202h, 302h snap out such that the latch members 202j abut the catch surfaces 104j of the panel frame 102. When the modules 200, 300 are inserted into the openings 104 from the rear side 102h of the panel frame, the opposite action occurs in which the catch surfaces 104j of the panel frame 102 act as a stop surface against the latch members 202j, 302j of the deflectable latches 202h, 302h, wherein as abutment of these surfaces occur, the deflectable latches 104e snap out such that the latch members 104g abut the catch surfaces 202n, 302n. The fully snapped-in configuration achievable from either front entry or rear entry can be seen most easily at FIGS. 3 to 5.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A modular telecommunications panel system comprising:
   a) a panel frame extending between a first end and a second end and extending between a front side and a rear side, the panel frame defining a module opening extending between the front and rear sides; and
   b) a telecommunications module removably received within the panel frame module opening, the telecommunications module including at least one of an aperture for receiving a telecommunications component and a telecommunications component;
   c) wherein the panel frame and telecommunications module are configured such that the telecommunications module can be received into and removed out of the module opening from the front side of the panel frame and can be received into and removed out of the module opening from the rear side of the panel frame, the telecommunications module being secured to the panel frame by a pair of deflectable latch arms at each of a first side and opposite second side of the telecommunications module and at each of a top side and a bottom side of the panel frame module opening.

2. The modular telecommunications panel system of claim 1, wherein the telecommunications module is secured to the panel frame with a snap-fit type connection.

3. The modular telecommunications panel system of claim 1, wherein the telecommunications module includes a plurality of apertures configured for receiving a plurality of telecommunications components configured as RJ-type jacks.

4. The modular telecommunications panel system of claim 1, wherein the telecommunications module houses a plurality of telecommunications components configured as RJ-type jacks.

5. The modular telecommunications panel system of claim 1, wherein the telecommunications module includes a first part of a first connection arrangement at each of the first and second sides of the telecommunications module, and wherein the panel frame module opening has a pair of sidewalls with each defining a second part of the first connection arrangement interconnecting with the first part of the first connection arrangement.

6. The modular telecommunications panel system of claim 5, wherein the telecommunications module defines a first part of a second connection arrangement at each of the top and bottom sides of the telecommunications module, and wherein the panel frame module opening has a top wall and a bottom wall with each defining a second part of the second connection arrangement interconnecting with the first part of the second connection arrangement.

7. The modular telecommunications panel system of claim 6, wherein the second part of the first connection arrangement acts as a stop member for the telecommunications module when the telecommunications module is inserted from the rear side of the panel frame, and wherein the second part of the second connection arrangement acts as a stop member for the telecommunications module when the telecommunications module is inserted from the front side of the panel frame.

8. The modular telecommunications panel system of claim 1, wherein the panel frame defines a 1 U rack height.

9. The modular telecommunications panel system of claim 1, wherein the panel frame is unitarily constructed as a single component.

10. The modular telecommunications panel system of claim 9, wherein the panel frame is formed from a polymeric material.

11. The modular telecommunications panel system of claim 1, wherein the module opening includes at least four module openings.

12. A modular telecommunications panel system comprising:
    a) a panel frame defining a module opening extending between a front side and a rear side, the panel frame including mounting locations for mounting the panel frame to a chassis; and
    b) a telecommunications module that can be received into and removed out of the module opening from the front side of the panel frame and that can be received into and removed out of the module opening from the rear side of the panel frame, the telecommunications module being secured to the panel frame at each of a first side and an opposite second side of the telecommunications module or being secured to the panel frame at each of a top side and a bottom side of the telecommunications module, wherein the telecommunications module is secured to the panel frame by deflectable latches integrally formed in both of the panel frame and the telecommunications module.

13. The modular telecommunications panel system of claim 12, wherein the telecommunications module is secured to the panel frame with a snap-fit type connection.

14. The modular telecommunications panel system of claim 12, wherein the telecommunications module opening includes a plurality of openings configured for receiving RJ-type jacks.

15. The modular telecommunications panel system of claim 12, wherein the telecommunications module houses a plurality of RJ-type jacks.

16. A telecommunications module receivable into a module opening in a panel frame comprising:
    a) the telecommunications module receivable through a front and rear side of the module opening in the panel frame; and
    b) a main body extending between first and second ends, top and bottom sides, and the front and rear sides, the main body either including a plurality of apertures for receiving a telecommunications component or providing access to a plurality of telecommunications components; and
    c) a pair of deflectable latch arms located proximate the first and second ends of the main body, the pair of deflectable latch arms of the panel frame being integrally formed with the main body and another pair of deflectable latch arms located on a top side and bottom side of the module opening in the panel frame.

17. The telecommunications module of claim 16, wherein the plurality of apertures are configured for receiving RJ-type jacks.

18. The telecommunications module of claim 16, wherein the telecommunications module houses a plurality of RJ-type jacks.

19. The telecommunications module of claim 16, wherein the telecommunications module is sized to fit within the panel frame module opening defining a 1 U rack height.

20. The telecommunications module of claim 16, wherein the plurality of apertures includes at least six apertures.

\* \* \* \* \*